United States Patent [19]

Valentian

[11] Patent Number: 5,140,939

[45] Date of Patent: Aug. 25, 1992

[54] APPARATUS AND CRUCIBLE FOR VAPOR DEPOSITION

[75] Inventor: Dominique Valentian, Rosny S/Seine, France

[73] Assignee: Societe Europeenne de Propulsion, Surenesnes, France

[21] Appl. No.: 802,085

[22] Filed: Dec. 3, 1991

[30] Foreign Application Priority Data

Dec. 7, 1990 [FR] France .................. 90 15368

[51] Int. Cl.⁵ .............................. C23C 14/24
[52] U.S. Cl. ......................... 118/719; 118/725
[58] Field of Search ..................... 118/719, 725

[56] References Cited

U.S. PATENT DOCUMENTS

| | | | |
|---|---|---|---|
| 3,343,518 | 9/1967 | Westeren | 118/725 |
| 3,632,429 | 1/1972 | Maeda | 118/725 |
| 3,705,567 | 12/1972 | Emels | 118/725 |
| 3,828,722 | 8/1974 | Reuter | 118/725 |
| 4,204,893 | 5/1980 | Cox | 118/725 |
| 4,211,182 | 7/1980 | Rosnowski | 118/725 |

FOREIGN PATENT DOCUMENTS

| | | |
|---|---|---|
| 485215 | 7/1977 | Australia . |
| 1112044 | 12/1959 | Fed. Rep. of Germany . |
| 62-153192 | 7/1987 | Japan . |

Primary Examiner—Richard Bueker
Attorney, Agent, or Firm—Weingarten, Schurgin, Gagnebin & Hayes

[57] ABSTRACT

The apparatus comprises a thermally insulating enclosure, first, second, and third diffusers for constituting first, second, and third isothermal heating zones respectively around first, second, and third compartments of a removable closed crucible designed to contain a source material in the first compartment and a substrate in the second compartment. The first, second, and third diffusers are thermally independent from one another by construction, each of them having a U-shaped section to surround the first, second, and third compartments of the crucible respectively.

The first, second, and third compartments are disposed in non-aligned manner along an angled line such that the angles between the first, second, and third compartments provide thermal decoupling of radiant energy between the compartments.

21 Claims, 7 Drawing Sheets

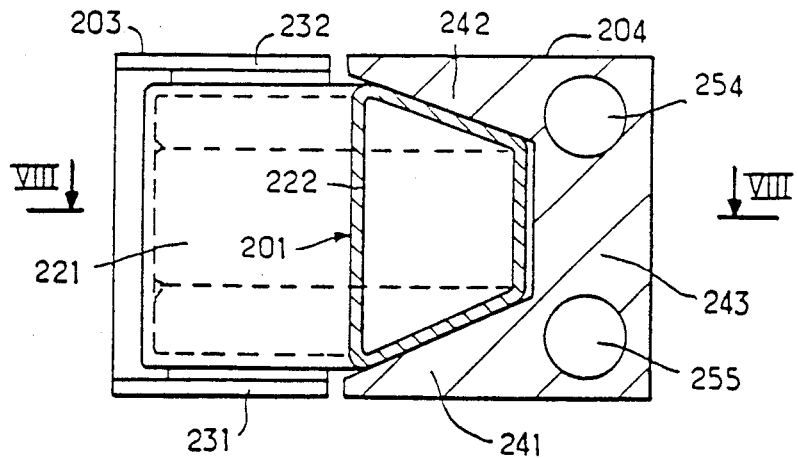
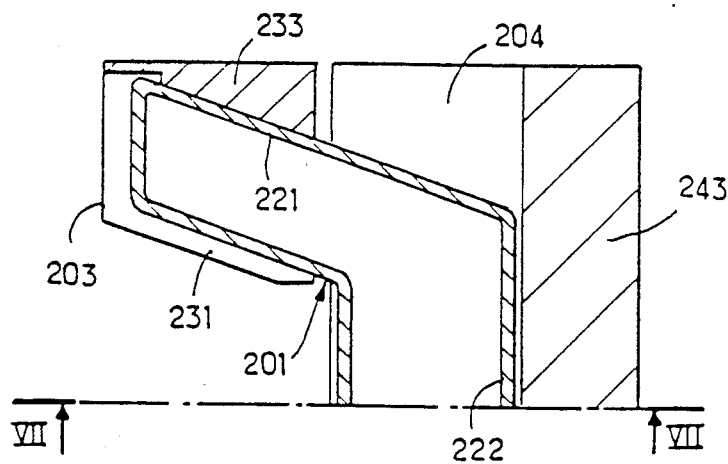
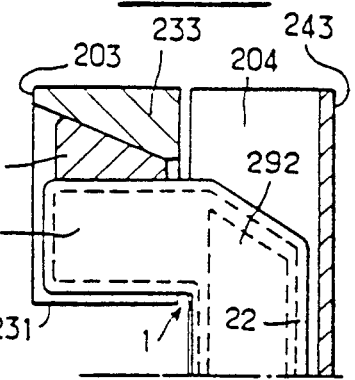
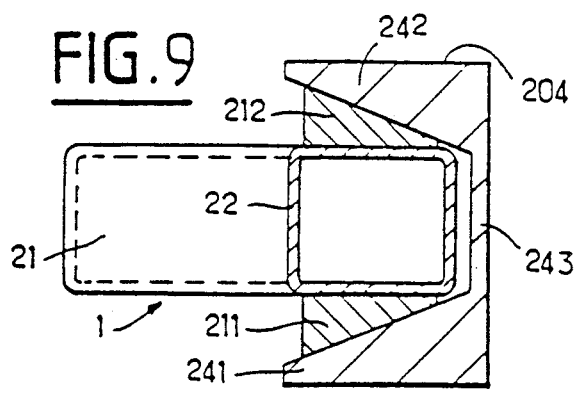
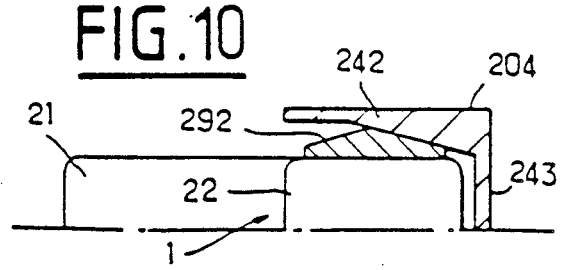
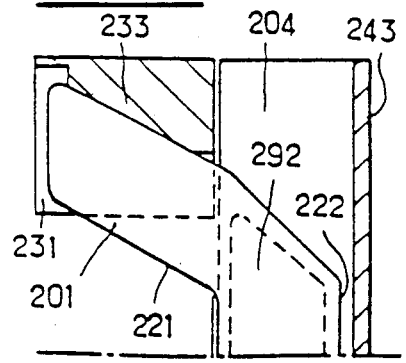

APPARATUS AND CRUCIBLE FOR VAPOR DEPOSITION

FIELD OF THE INVENTION

In general terms, the invention relates to the techniques of vapor deposition at high temperature, e.g. about 900° C., whether implemented on Earth or in space under conditions of weightlessness. Such vapor deposition techniques require temperature profiles to be maintained with very high accuracy to enable experiments to be performed in thermodiffusion, thermomigration, crystal growth, or epitaxial deposition.

More particularly, the invention relates to a crucible for vapor deposition at high temperature, the crucible comprising an enclosure with a plurality of compartments defining successive constant-temperature or "isothermal" zones in which a vapor source material and a vapor-receiving substrate are placed.

The invention also relates to apparatus for vapor deposition at high temperature, the apparatus comprising a thermally insulating enclosure, and diffusing means for producing zones of isothermal heating conditions in successive compartments of a removable closed crucible for containing both a vapor source material and a vapor-receiving substrate.

PRIOR ART

Ovens for vapor diffusion or vapor crystal growth are made with two or three isothermal zones enabling transfers to take place from a hot zone (source) to a deposition zone, and possibly also to a colder zone (sink).

In particular, a known multizone oven 300 as shown in FIG. 14 comprises three colinear isothermal zones Z1, Z2, and Z3. In that case, a cartridge 315 contains a bulb 310 which in turn contains the source material 313 and the substrate 316 on which chemical vapor deposition is to be performed. The cartridge is rectilinear, being essentially cylindrical in shape, and it is placed inside a metal body 307 which is also cylindrical and which is provided with a superinsulating lining 308. The body includes three diffuser blocks 301, 302, and 303 provided with respective heater elements 321, 322, and 323 which are separated from one another by superinsulating devices 304, 305, and 306 and which are spaced apart along the oven to create a first isothermal zone Z1 acting as a source, a second isothermal zone Z2 in which deposition takes place, and a third isothermal zone Z3 constituting a heat sink, with a stronger heat sink 309 being further provided following the third isothermal zone Z3. The bulb 310 itself comprises a first compartment situated in the first isothermal zone Z1 and containing crystals constituting a source of material which is to be deposited in a central second compartment situated in the second isothermal zone. Crystals 314 may also be placed, where appropriate, in a third compartment situated in the third isothermal zone and constituting a heat sink. Vapor-passing grids 311 and 312 separate the various different compartments in the bulb 310. By way of example, the isothermal zones Z1, Z2, and Z3 may have the following temperatures respectively: 810° C., 805° C., and 797° C., and the additional heat sink 309 situated beyond the bulb 310 may itself have a temperature of about 100° C.

The multizone oven as shown in FIG. 14 suffers from several drawbacks relating to its structure.

In particular, for experiments that are to take place in microgravity during missions in space on board space shuttles, for example, it is possible to process only one cartridge per flight since the cartridge 315 is installed in the oven 300 before departure and is extracted after return. It is therefore not possible to perform automatic cartridge (crucible) exchanges during a single flight.

The way the oven is configured with three successive heating zones that are colinear gives rise to considerable bulk. For example, the hot portion of a multizone oven as shown in FIG. 14 may be about 60 mm in diameter and it may be more than 450 mm long.

The length of the crucible 315 makes it very difficult to examine its central zone optically.

Further, cooling transitions are very long because the central zone has very low heat losses and heat transfers occur between the three isothermal zones by radiation such that the mutual effects between the various zones make controlling changes in temperature more difficult.

OBJECT AND SHORT DESCRIPTION OF THE INVENTION

The present invention seeks to remedy the above-mentioned drawbacks and to enable a multizone oven and a crucible for vapor deposition at high temperature to be made that are compact, robust, easy to make and to use, and that enable a plurality of samples to be treated automatically in succession, particularly in microgravity in space stations.

More particularly, the invention also seeks to facilitate examining a sample while it is being treated, and to enable the temperature, in particular of the central zone, to be measured optically, and to provide improved control of this temperature by additionally setting up an excellent thermal decoupling between the three zones.

These various objects are achieved by a crucible for vapor deposition at high temperature comprising an enclosure including the following in succession: a first compartment for containing a source material in a source first isothermal zone at high temperature; a second compartment for containing at least one substrate in a deposition second isothermal zone; and a third compartment for constituting a third isothermal zone that forms a heat sink; separation grids being disposed firstly between the first and second compartments and secondly between the second and third compartments; the crucible being characterized in that the first, second, and third compartments are disposed in non-aligned manner along an angled line such that the angles between said first, second, and third compartments provide thermal decoupling of radiant energy between said compartments.

Because of the special disposition of the compartments in the crucible which is in the form of an angled line, the crucible can be both compact and more rigid than a tubular crucible that is rectilinear, while being suitable for use in an oven that provides better thermal decoupling of radiant energy between the various isothermal zones.

Preferably, the crucible is made of a material that is transparent to infrared radiation, such as quartz, and it includes planar observation windows in its connection portions firstly between the first and second compartments and secondly between the second and third compartments.

Advantageously, the planar observation windows are inclined relative to the axis of the second compartment in such a manner that a polarized observation light beam propagating along the axis of the second compartment strikes said observation windows at the Brewster angle.

Observation by means of a light beam makes it possible, in particular, to determine the pressure of the gas by interferometry, to determine its temperature by infrared pyrometry or by fluorescence, and to determine the thickness of the deposit or the shape of the crystal during growth.

In a first possible embodiment, the first, second, and third compartments are disposed in a U-shaped structure.

In this configuration, the first and third compartments are perpendicular to the second compartment, or in a variant embodiment, each of the first and third compartments is at an obtuse angle to the second compartment, thereby constituting a U-shaped structure with two diverging branches.

In another embodiment, the first, second, and third compartments are disposed in a Z-shaped structure. A U-shaped structure is particularly adapted to use in space under conditions of microgravity, while also being usable on the Earth.

A Z-shaped structure makes it possible on the Earth, when under the influence of gravity, to obtain a stratification effect enabling natural convection to be attenuated or eliminated.

The section of the crucible may be rectangular, trapezoidal, or, where appropriate, circular for use with high vapor tensions.

The invention also provides an apparatus for vapor deposition at high temperature, the apparatus comprising a thermally insulating enclosure, and first, second, and third diffusers for constituting first, second, and third isothermal heating zones respectively around first, second, and third compartments of a removable closed crucible designed to contain a source material in said first compartment and a substrate in the second compartment; the apparatus being characterized in that the first, second, and third diffusers are thermally independent from one another by construction, each of them having a U-shaped section to surround the first, second, and third compartments of the crucible respectively, and in that said first, second, and third compartments are disposed in non-aligned manner along an angled line such that the angles between said first, second, and third compartments provide thermal decoupling of radiant energy between said compartments.

The thermal independence of the various diffusers comes in particular from the fact that the heater resistances within a single diffuser are directly connected to an electrical current, independently of the resistances in the other diffusers, and from the fact that the heater resistances are integrated in plates having high thermal inertia, which plates are separated from one diffuser to the next by insulating gaps.

Each of the first, second, and third diffusers is fixed on a common base by insulating columns in order to improve thermal decoupling between the diffusers.

Advantageously, at least the second diffuser includes heat pipes for ensuring that the corresponding zone of said diffuser is indeed isothermal along the axis of the second compartment of the crucible.

The combined effect of the crucible's angled line structure, which allows radiative thermal decoupling, the thermal independence of the various diffusers, and the presence of the insulating columns, ensures an effective thermal decoupling between the three isothermal zones, and this constitutes an important effect of the present invention.

More particularly, the crucible is made of a material that is transparent to infrared radiation, such as quartz, and includes planar observation windows in its connection portions, firstly between the first and second compartments and secondly between the second and third compartments, and the insulating enclosure of the apparatus includes thermally insulating removable plugs located opposite the planar observation windows to enable light rays to be sent selectively along the axis of the second compartment of the crucible in order to observe the deposit inside said second compartment optically.

In another aspect of the present invention, the insulating enclosure includes a door extending essentially along the longest dimension of the second compartment of the crucible and movable in a direction that is essentially transverse relative to the axis of the second compartment, thereby enabling the crucible to be loaded and unloaded.

The apparatus of the invention lends itself to a variety of embodiments which are all convenient to implement and which facilitate good thermal decoupling between the various isothermal zones while retaining the advantages of compactness, ruggedness, ease of loading and unloading a crucible, and accessibility to the central deposition zone to enable the deposition process to be observed directly or by means of a television camera, and, where appropriate, to enable temperature regulation to be performed.

The general structure of the apparatus may thus be U-shaped, with the first, second, and third compartments of the crucible being disposed in a U-shaped structure as are the first, second, and third diffusers for establishing distinct isothermal zones in said first, second, and third compartments.

Under such circumstances, in one of the embodiments, the crucible is rectangular in section, the first, second, and third U-shaped section diffusers include at least one inside wall that is sloping, and triangular-section heat conducting wedges are interposed between the crucible and the sloping inside walls of the diffusers.

In another particular embodiment, the crucible has a trapezoidal section, each of the first and third compartments is at an obtuse angle relative to the second compartment, thereby constituting a U-shaped structure with two diverging branches, and the first, second, and third diffusers match the shapes of the crucible in such a manner as to provide both direct thermal contact by conduction between the first, second, and third diffusers and the first, second, and third compartments respectively, and also automatic centring of the crucible.

However, to facilitate manufacture, the number of faces of the crucible and of the diffusers that are in contact with one another may be reduced to four, i.e. the two sloping faces of the central compartment and one face of each of the end compartments.

The apparatus may also have a heating assembly whose general structure is Z-shaped. In which case, the first, second, and third compartments of the crucible, and the first, second, and third diffusers are disposed in a Z-shaped structure.

According to an advantageous characteristic that enables a plurality of samples contained in different crucibles to be treated automatically in succession, the apparatus includes an automatic crucible loading and unloading mechanism having a vertical storage passage for storing crucibles, a carriage for positioning the crucibles in the vertical storage passage, and door displacement means for automatically transferring a crucible between the vertical storage passage and the thermally insulating enclosure and vice versa.

BRIEF DESCRIPTION OF THE DRAWINGS

Other characteristics and advantages of the invention appear from the following description of particular embodiments given by way of example and with reference to the accompanying drawings, in which:

FIG. 7 is a fragmentary vertical section view on plane VII—VII of FIG. 8 showing a variant embodiment of a crucible and an oven that are U-shaped with a trapezoidal cross-section;

FIG. 8 is a fragmentary horizontal section view on plane VIII—VIII of FIG. 7 showing a form of U-shaped crucible having diverging arms that are not perpendicular to its central portion;

FIGS. 9 and 10 are fragmentary vertical section views showing particular arrangements of a rectangular section U-shaped crucible in sloping wall U-section thermal diffusers, with interposed conducting wedges;

FIGS. 11 and 12 are fragmentary horizontal section views showing particular arrangements of a U-shaped crucible in sloping walled U-section thermal diffusers, optionally together with interposed heat conducting wedges;

DETAILED DESCRIPTION OF PARTICULAR EMBODIMENTS

Figure 1:
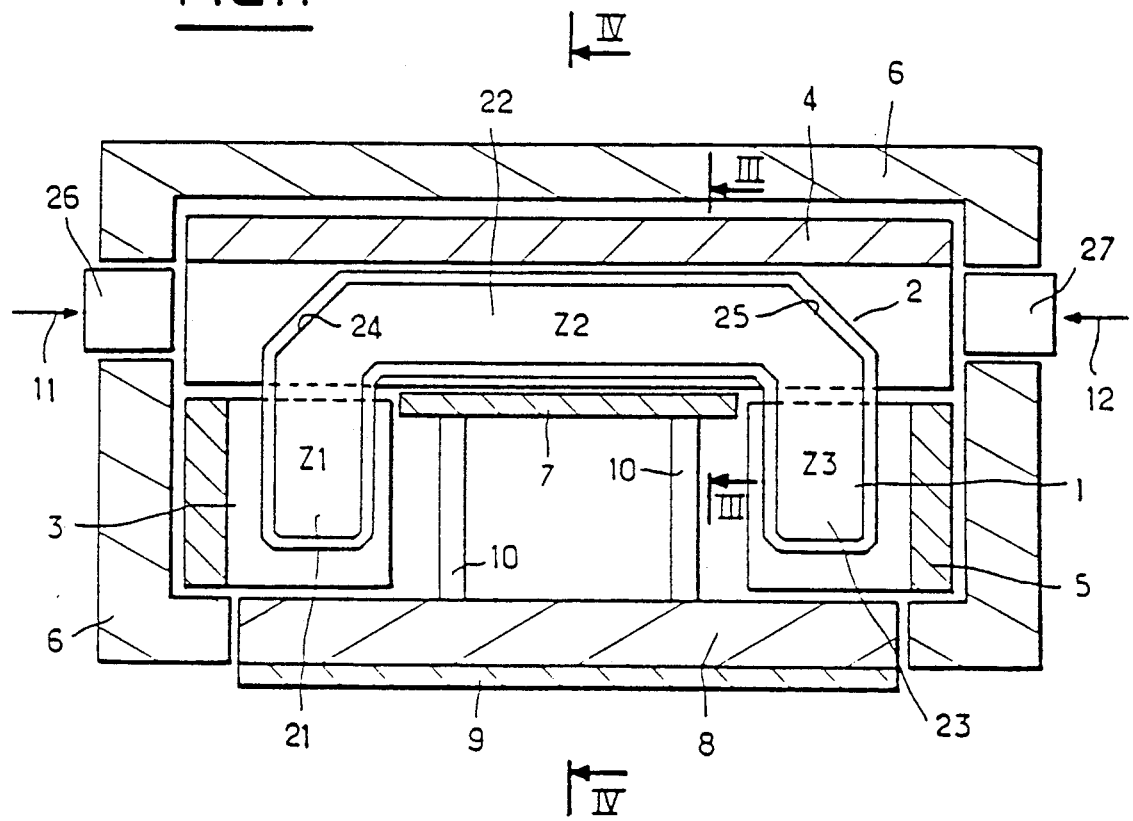
FIG. 1 is a diagrammatic horizontal section through a first embodiment of a vapor deposition apparatus of the invention having a crucible and an oven that are U-shaped.

The description begins with reference to FIGS. 1 to 4 which show a first embodiment of apparatus of the invention for performing vapor deposition, such as vapor diffusion or crystal growth.

In general, and unlike rectilinear multizone ovens of the prior art, the apparatus of the invention is characterized by the use of a crucible having successive different coplanar lengths separated from one another by vapor-permeable grids, with the lengths extending along an angled line and corresponding to different temperature zones, and with the two free ends of the angled line being closed by end walls.

In the embodiment of FIGS. 1 to 4, the crucible 1 is generally U-shaped in structure, having a rectilinear central portion 22 defining a compartment for receiving one or more substrates 63 (FIG. 3), and two end branches 21 and 23 which are substantially perpendicular to the rectilinear central portion 22. The first end branch 21 of the crucible 1 defines a source first compartment for containing crystals 64 of a vapor-emitting material, while the second end branch 23 of the crucible 1 defines a third compartment constituting a heat sink and which may, where appropriate, also contain a few crystals.

Figure 3:
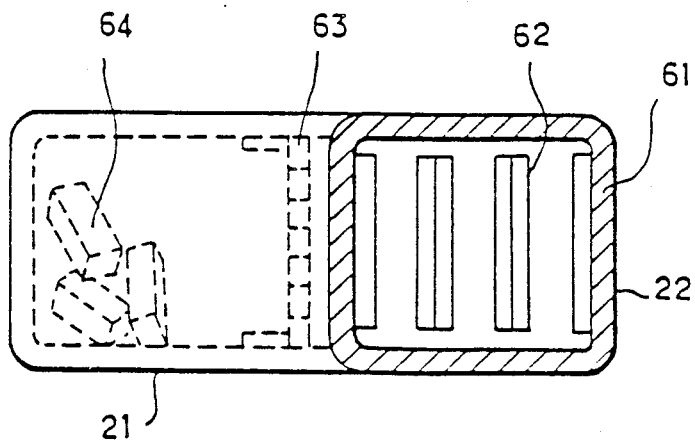
FIG. 3 is a fragmentary section view on plane III—III of FIG. 1 showing details of the structure and of the contents of the U-shaped crucible.
Figure 2:
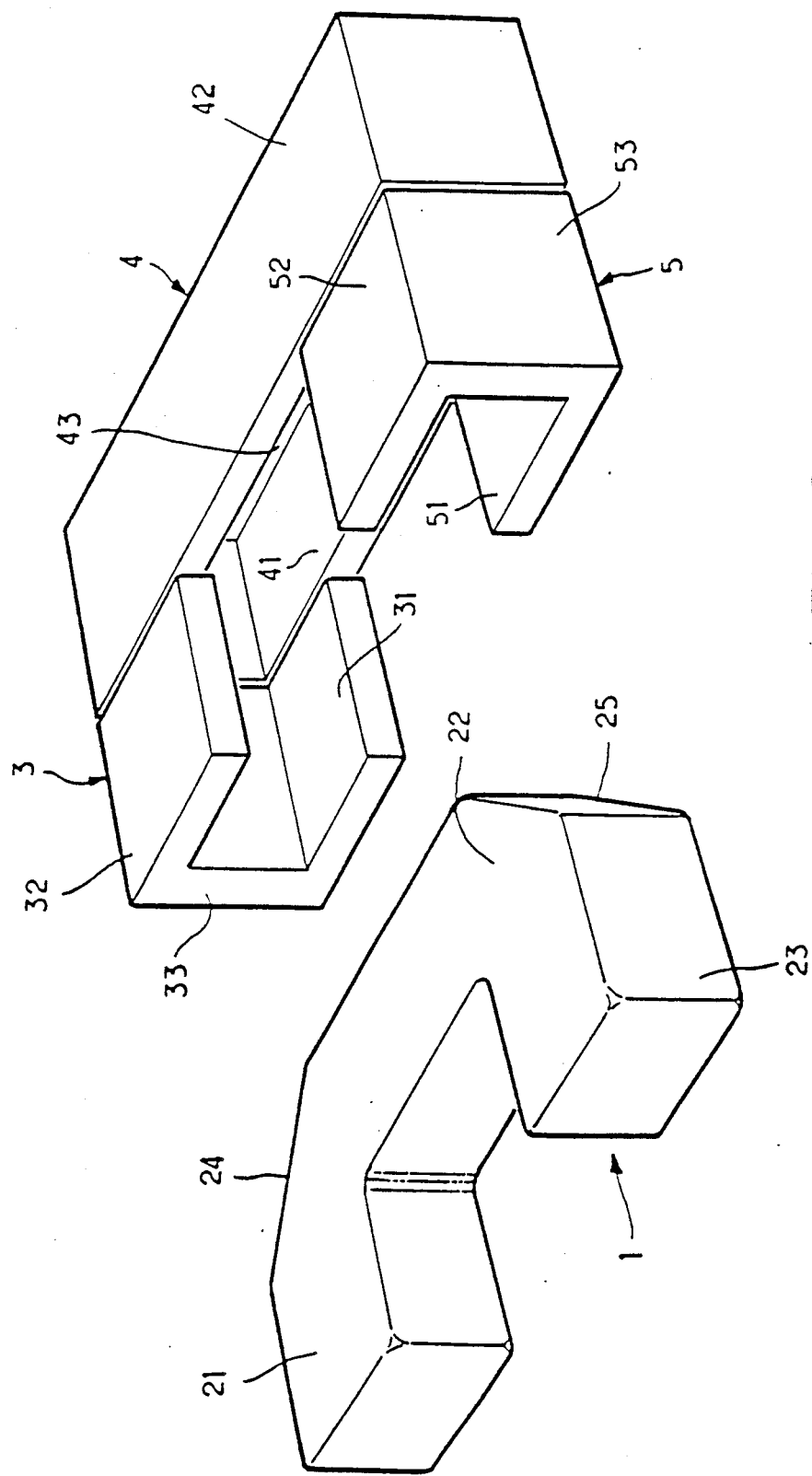
FIG. 2 is an exploded perspective view of the crucible and the heater assembly of the FIG. 1 apparatus.

The grids such as the grid 63 in FIG. 3 separate each of the compartments in the end branches 21 and 23 from the compartment in the central rectilinear body 22 of the crucible 1.

The crucible 1, which is e.g. made of quartz or silica, can be quite small, for example its longest dimension need not exceed about 150 mm, whereas conventional rectilinear crucibles are generally about twice as long.

Figure 4:
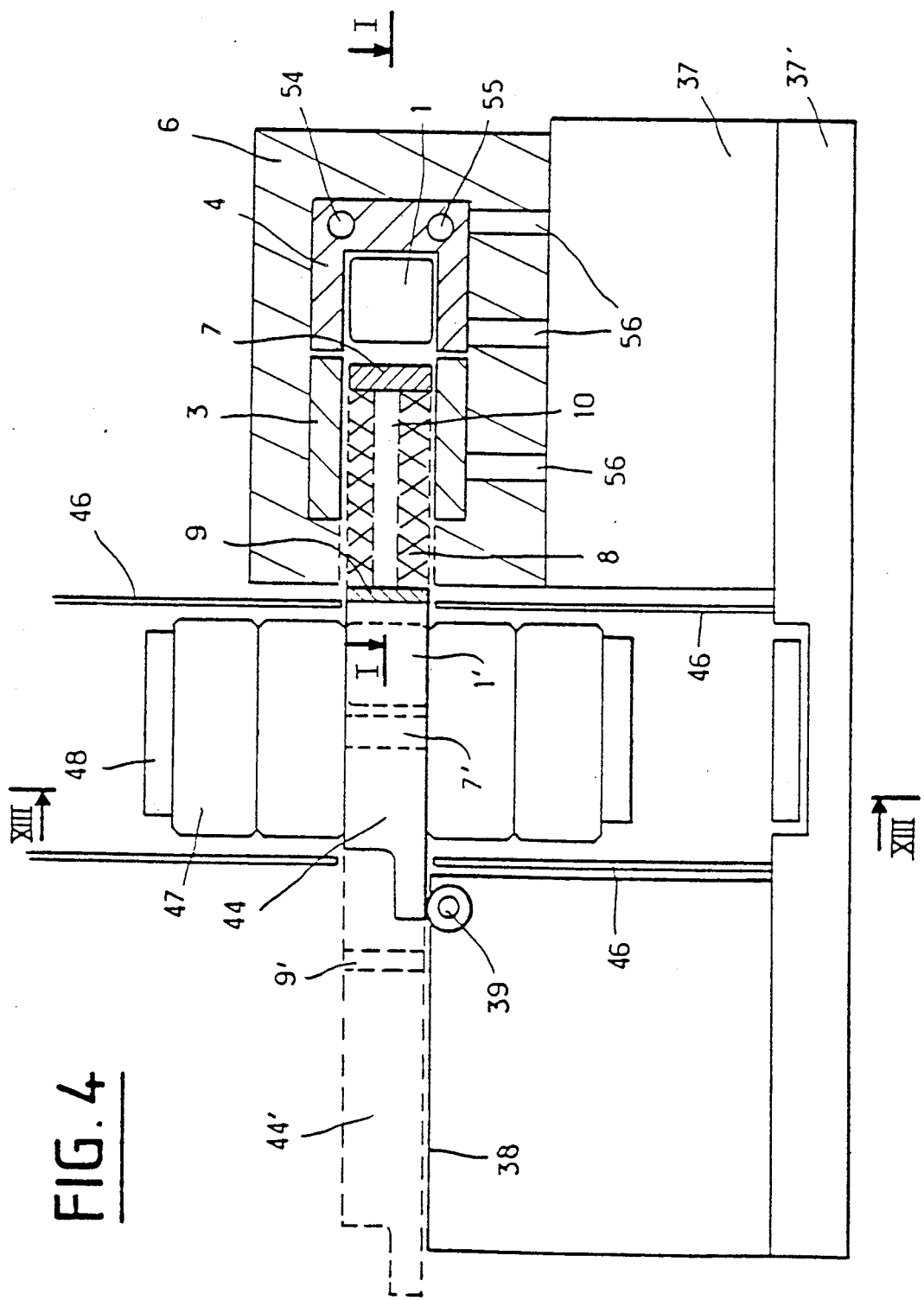
FIG. 4 is a vertical section view through the apparatus of FIG. 1 on plane IV—IV of FIG. 1.

The crucible 1 is intended to be placed in an oven that may include a thermally insulating enclosure 6 that is essentially rectangular in shape. A door 9 also including thermal insulation 8 and an internal hot plate 7 which is held relative to the door proper 9 by insulating columns 10 is integrated in the enclosure 6 on a main front face giving access to the crucible 1 and enabling it to be loaded and unloaded in a transverse direction relative to the central compartment 22 (FIGS. 1 and 4).

The U-shaped crucible 1 is placed inside the oven between thermal diffusers 3, 4, and 5 (FIGS. 1, 2, and 4), each of which is generally U-shaped in structure, and they are disposed relative to one another around a U-shape to surround three sides of each of the compartments 21, 22, and 23 of the crucible 1, while still allowing the crucible 1 to be disengaged simply by sliding when the door 9 is open.

The compartment 21 in the first end branch of the crucible 1 for containing the source material for the vapor is heated by the U-shaped diffuser 3 which overlies the compartment 21 by means of its central rear face 33 and its bottom and top side branches 31 and 32.

In similar manner, and symmetrically about the vertical plane of symmetry of the crucible 1, the compartment 23 in the second end branch of the crucible 1 constituting a heat sink is heated by the U-shaped diffuser 5 which overlies the compartment 23 by means of its center rear face 53 and its bottom and top side branches 51 and 52.

The U-shaped diffuser 4 for heating the central compartment 22 of the crucible 1 containing the substrates that receive the vapor fit around the shape of the central compartment and has a rear vertical face 43 and bottom and top side branches 41 and 42.

In the present description, the terms "vertical" or "horizontal" are naturally not limiting, especially insofar as the apparatus is itself particularly adapted for use in a space station. These terms are used merely to facilitate understanding, using the convention that the plane of FIG. 1 is horizontal.

The disposition of the diffusers 3, 4, and 5 prevents any radiant energy transfer between the three isothermal zones, i.e. the source zone Z1, the deposition zone Z2, and the heat sink zone Z3 respectively containing the compartments 21, 22, and 23 of the crucible 1, thereby making it possible to obtain better control of temperature conditions.

Each diffuser may be heated, for example, by means of electrical resistances.

The heater electrical resistance within a single diffuser are connected directly to a source of electricity independently from the resistances in the other diffusers. In addition, the high thermal inertia plates in which the resistances are integrated and which constitute the bodies of the diffusers are separated from one diffuser to another by insulating gaps. This contributes to reinforcing thermal decoupling between the three isothermal zones.

The isothermal nature of each zone can be ensured by heat pipes 54 and 55, e.g. based on potassium, sodium, or lithium, depending on the intended temperature (which may, for example, lie in the range 500° C. to 1200° C.).

The thermal insulation present inside the enclosure of the oven 6 or in the door 9 (space 8) may be constituted by evacuated superinsulation.

The hot plate 7 integrated in the door 9 and positioned relative to the door 9 by insulating columns 10 surrounded by insulating material 8 contributes to closing the heater device constituted by the diffuser 4 over the face of the crucible 1 that faces the door 9.

Insulating plugs 26 and 27 may be placed removably in the insulating enclosure 6, e.g. in line with the main compartment 22 as shown in FIG. 1, or where applicable in line with the side branches 21 and 22.

On being removed, the insulating plugs 26 and 27 allow a beam of light 11, 12 to pass through the transparent crucible 1 to enable the deposition zone Z2 to be observed, either directly or else by means of a camera, thus enabling the deposition process to be monitored and optionally to be regulated.

Advantageously, the light beam 11, 12 penetrates into the crucible 1 via windows 24, 25 constituted by planar surfaces that slope relative to the axis of the beam 11, 12 so that the beam arrives at a Brewster incidence. This contributes to reducing reflection losses in polarized light.

In FIG. 1, the windows 24 and 25 constitute flats extending between outside edges in linking zones between the side branches 21 and 23 and the central compartment 22.

Observation by means of a light beam makes it possible, in particular, to determine:
the pressure of the gas (by interferometry);
its temperature (by infrared pyrometry or by fluorescence); and
the thickness of the deposit or the shape of the crystal that is growing.

After optical examination, the plugs 26 and 27 may be closed to avoid distortions in the temperature field.

The U-shaped structure of the crucible is thus particularly advantageous insofar as it enables growth in the central compartment 22 to be examined without either of the other two compartments 21 and 23 constituting visual obstructions.

The compact configuration of the oven also serves to reduce heat losses and to increase the robustness of the oven, in particular with respect to vibration, and also the ruggedness of the crucible. Furthermore, in particular because of an appropriate selection for the section of the crucible (rectangular or trapezoidal), it is possible to place a larger number of samples inside the crucible 1 than in a cylindrical crucible. The disposition in an angled-line shape, in particular in a U-shape, enables the oven to provide genuine thermal impedance between the three zones Z1, Z2, and Z3, and in particular it makes it possible to raise or lower temperature in each of the zones independently from the other two.

Figure 13:
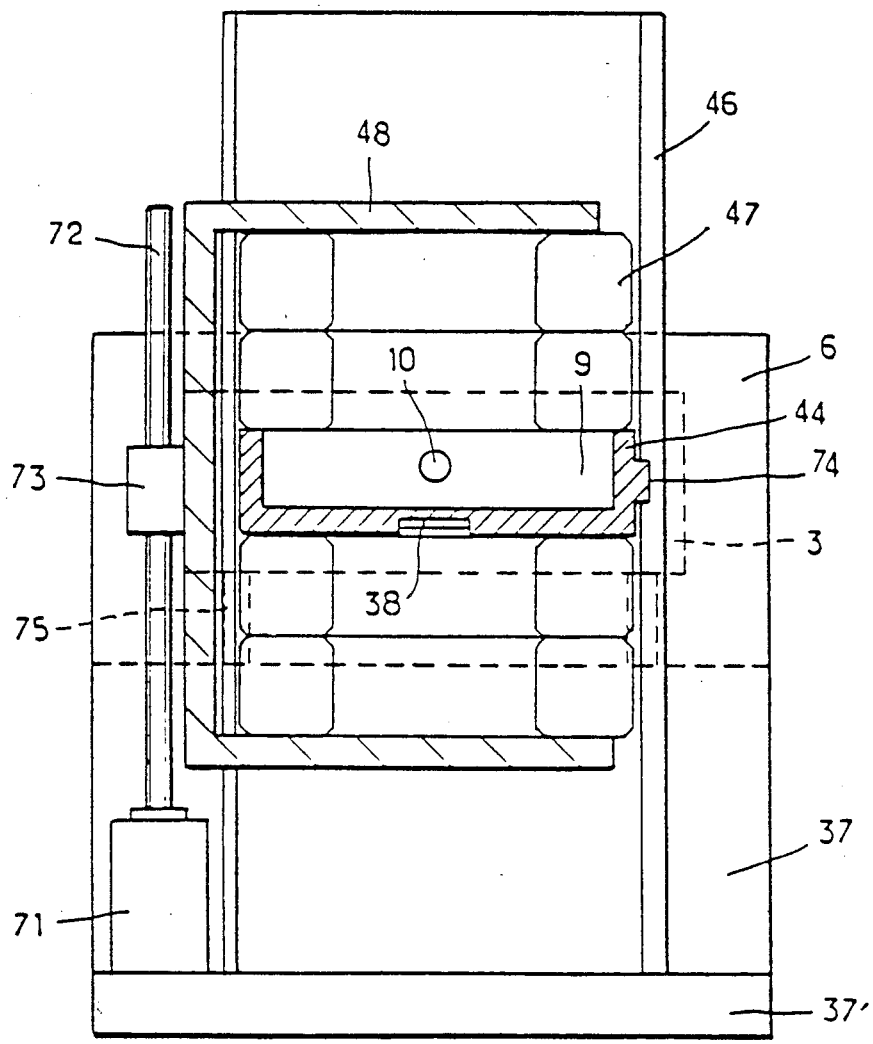
FIG. 13 is a section view on plane XIII—XIII of FIG. 4, showing a crucible loading and unloading mechanism.
Figure 14:
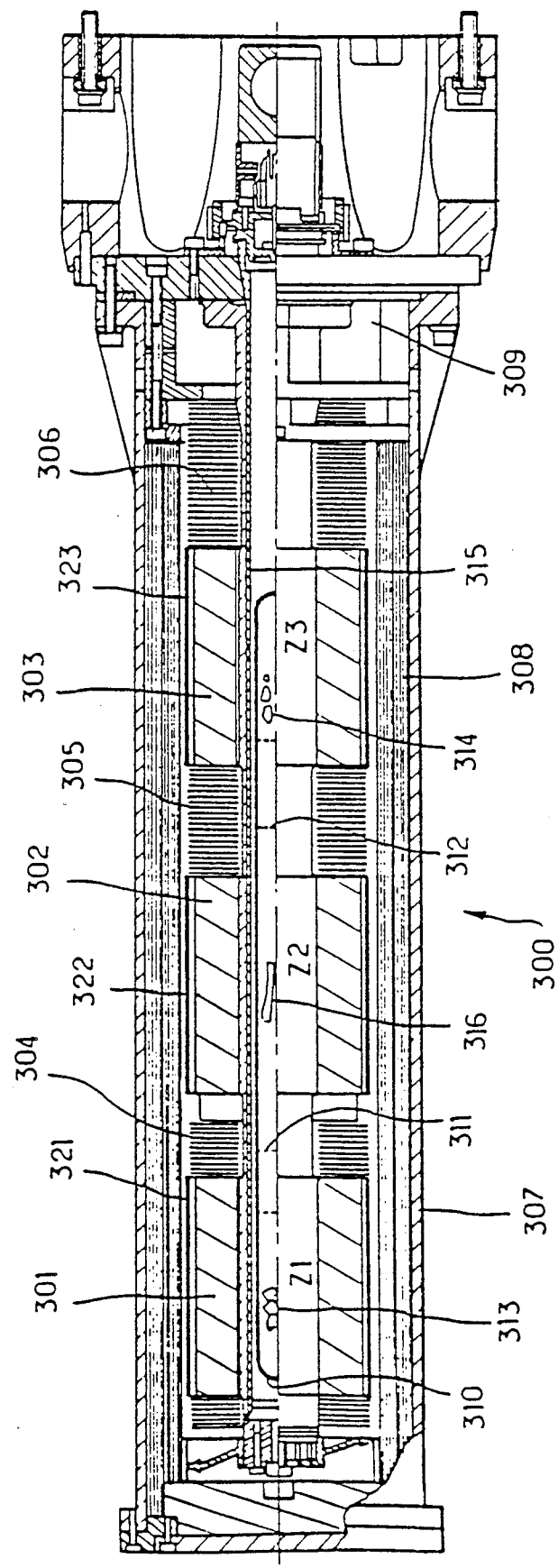
FIG. 14 is a longitudinal section view through a rectilinear multizone oven of the prior art for performing vapor deposition.

FIGS. 4 and 13 show how an automatic loading system may be associated with the oven.

The samples 47 are placed in a vertical passage or well 46 and they are positioned by a carriage or indexing mechanism 48 that moves along the passage 46 under drive from a drive mechanism of the type comprising a nut 73 secured to the carriage 48 and a screw 72 meshing with the nut 73 and rotated by an electrical drive motor 71 (FIG. 13). The unloading door 9 together with its thermally insulating material 8 and its hot plate 7 may be displaced, for example by a rack 38 and pinion 39 system under the control of an oven loading and displacement-providing mechanism.

FIG. 4 shows a drawer 44 for controlling the loading door 9. The drawer 44 and the door 9 are shown in solid lines in their working position in which the crucible 1 is installed in the oven. These items are also shown in their loading or unloading position by means of dashed lines where they are referenced by numerals associated with prime symbols. Thus, there can be seen in dashed lines the drawer 44', the door 9', together with its parts 7' and 8' and the crucible 1' removed from the oven to exchange crucibles. The drawer 44 is guided horizontally by a rib 74 engaged in a groove formed horizontally in one of the walls of the passage 46 perpendicularly to the loading door 9 (FIG. 13). A gap 75 is formed in the rear portion of the carriage 48 to enable the carriage 48 to move down to the vicinity of the base 37' without knocking against the motor 71.

The way in which the crucibles containing the various samples to be treated in succession in the oven are stored in a stack is very compact and provides good resistance to vibration. A plate of damping material may also be disposed between each pair of crucibles 47 to provide better vibration performance.

Naturally the device for loading and unloading crucibles may have a wide variety of forms so long as it enables a crucible to be treated to be inserted in the oven and retrieved therefrom by means of a lateral loading door 9 which is secured to a sample-receiving drawer 44.

FIG. 4 also shows columns 56 serving to isolate the diffusers 3, 4, 5 relative to a base 37 supporting the insulating enclosure 6.

The vapor deposition oven is particularly adapted to use in space stations where the deposition process is facilitated by the absence of any natural convection motion in the vapor, whereas this phenomenon is inevitable on Earth, where it slows down the rate of crystal growth.

However, the apparatus of the invention retains all of its advantages when it is used on Earth, and in this case it may even present other types of configuration more easily, for example, its thermal zones may be disposed in a Z-shaped configuration or as the steps of a staircase.

Figure 5:
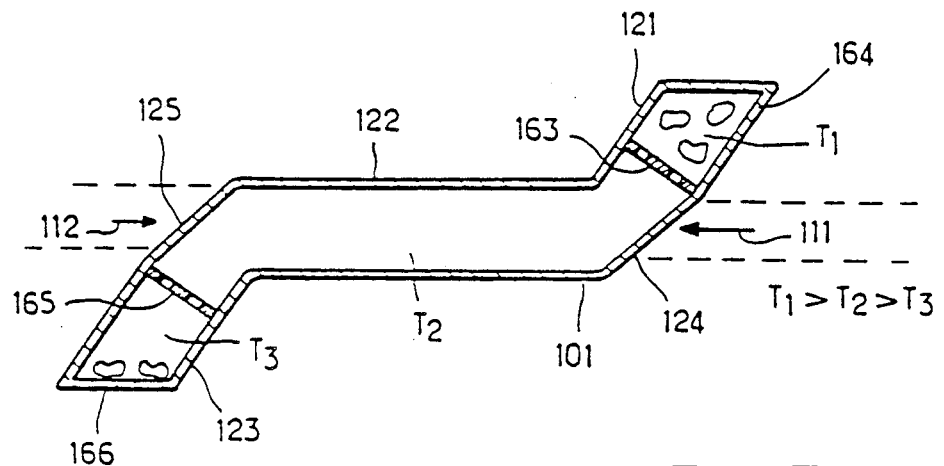
FIG. 5 is an axial section view through a Z-shaped crucible of the invention.

FIG. 5 thus shows a Z-shaped crucible 101 which makes it possible, in particular, to obtain a stratification effect when operating on Earth, i.e. under the influence of the Earth's gravity (1 g), thereby attenuating or eliminating natural convection.

In the same manner as the U-shaped crucible 1, the Z-shaped crucible 101 has a rectilinear central deposition compartment 122 extended at its ends by end branches 121 and 123 which respectively define a source compartment containing crystals 164 to be vaporized and a compartment that forms a heat sink and that may also contain a few crystals 165. The end branches 121 and 123 are now directed in opposite directions relative to the central compartment, thereby forming a Z-shape. As in the preceding embodiment, grids 163 and 165 provide vapor-permeable separation between the compartments. Windows 124 and 125 that slope relative to the axis of the central compartment 122 enable an observation light beam 111, 112 to pass therethrough, which beam preferably arrives at a Brewster angle. The windows 124 and 125 may be in line with the outside walls of the end compartments 121 and 123, or the contrary they may be at a certain angle relative thereto, as shown in FIG. 5.

Figure 6:
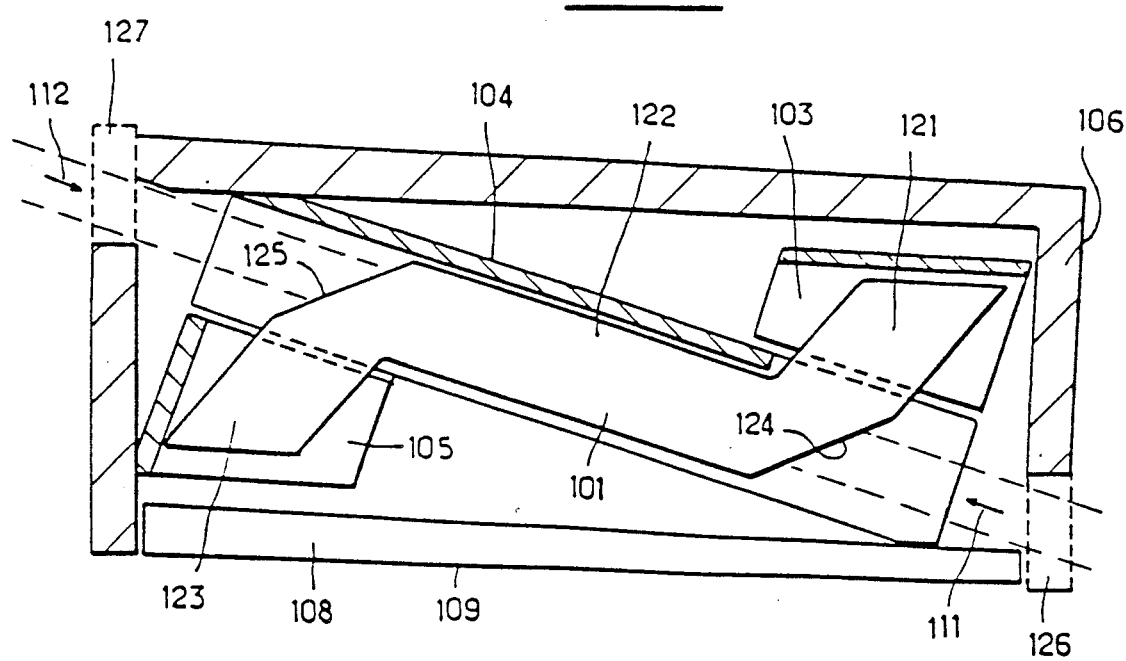
FIG. 6 is a diagrammatic horizontal section view through a second embodiment of a vapor deposition apparatus of the invention with a crucible and an oven that are Z-shaped.

FIG. 6 shows how the FIG. 5 crucible 101 can be integrated in an oven which includes U-section diffusers 103, 104, and 105 that are disposed, in this case, in a Z-configuration.

As in the preceding embodiment, the oven of FIG. 6 comprises an insulating enclosure 106 and a loading door 109, similarly provided with an insulating lining 108 and which may be entirely similar in structure to the corresponding parts of the embodiment shown in FIGS. 1 to 4. Removable insulating closure plugs 126 and 127 also serve to pass observation light beams 111 and 112 selectively through the crucible 101.

To limit size, the crucible 101 may be disposed inside the enclosure 106 with the axis of the central deposition compartment 122 at an angle relative to the main faces of the enclosure 106. The diffusers 103, 104, and 105 that establish the isothermal temperature zones in the compartments 121, 122, and 123 are U-shaped in section and they are placed in a Z-configuration to fit around the shape of the crucible 101 while still enabling the crucible 101 to be removed via the loading door 109. The diffuser that is situated further back from the door 109 than the central diffuser 104 (i.e. the diffuser 103 in FIG. 6) may have a vertical face which is mounted parallel to the main faces of the enclosure 106, as shown in the drawing, but it could alternatively be disposed transversely like the vertical face of the diffuser 105.

FIGS. 7 to 12 show several variants applicable to the crucible 1 and the diffusers 3 to 5 of FIGS. 1 to 4, and also to the crucible 101 and the diffusers 102 to 105 of FIG. 6.

FIGS. 7 and 8 show a portion of a crucible 201 co-operating with U-shaped diffusers 204 and 203 but having lateral branches 241 and 242 or a central branch 233 that are inclined so as to match the shape of the crucible 201 whose section is trapezoidal instead of being rectangular, and having end branches such as 221 that point outwards, i.e. that diverge towards the outside. In this embodiment, the inside faces of the branches 241 and 242 of the diffuser 204 come into contact with the wall of the central compartment 202 of the crucible 201 and the inside face of the central branch 233 of the diffuser 203 is in contact with the wall of the compartment 221. Similarly, the third diffuser (not shown) is in contact with the third compartment of the crucible 201 in a manner similar to the first diffuser 203.

In this variant, thermal contact between each of the three isothermal zones and each of the diffusers is thus ensured by conduction.

The two open V-shaped sections of the three assembled-together diffusers additionally constitute means for automatically centering the crucible 201.

FIGS. 9 to 12 relate to variant embodiments in which the crucible 1 is rectangular in section as in FIGS. 1 to 4, but in which the diffusers such as 203 and 204 have sloping inside faces, as in the variant of FIGS. 7 and 8. Under such circumstances, contact between the rectangular section crucible 1 and the open V-shaped opening of a diffuser is ensured by means of heat-conducting wedges 291, 292, and 293.

FIG. 10 shows a special shape for the wedges 292 that enables the bulk of the diffuser to be reduced.

FIG. 12 shows a variant in which the crucible 201 is rectangular in section but its end branches such as the branch defining the compartment 221 form an open V-shape and diverge outwards, as in FIGS. 7 and 8, i.e. they are not perpendicular to the central compartment. FIG. 12 thus shows a conducting wedge 292 interposed between the central compartment 222 and the central diffuser 204 while the compartment 221 is in direct contact with the sloping vertical wall of portion 233 of the diffuser 203.

In FIG. 7, references 254 and 255 designate locations for heat pipes serving to ensure a uniform temperature between the two ends of the central portion 243 of the central diffuser 204.

The apparatus of the invention is applicable to various types of vapor disposition, particularly in space, but it is also suitable for use in applications on Earth, e.g. in ovens for epitaxial growth of doped monocrystals for use in the infrared (Hg Cd Te, In Sb, for example).

I claim:

1. A crucible for vapor deposition at high temperature comprising an enclosure including the following in succession: a first compartment for containing a source material in a source first isothermal zone at high temperature; a second compartment for containing at least one substrate in a deposition second isothermal zone; and a third compartment for constituting a third isothermal zone that forms a heat sink; separation grids being disposed firstly between the first and second compartments and secondly between the second and third compartments; wherein the first, second, and third compartments are disposed in non-aligned manner along an angled line such that the angles between said first, second, and third compartments provide thermal decoupling of radiant energy between said compartments.

2. A crucible according to claim 1, made of a material that is transparent to infrared radiation, such as quartz, and wherein it includes planar observation windows in its connection portions firstly between the first and second compartments and secondly between the second and third compartments.

3. A crucible according to claim 2, wherein the planar observation windows are inclined relative to the axis of the second compartment in such a manner that a polarized observation light beam propagating along the axis of the second compartment strikes said observation windows at the Brewster angle.

4. A crucible according to claim 1, wherein the first, second, and third compartments are disposed in a U-shaped structure.

5. A crucible according to claim 4, wherein the first and third compartments are perpendicular to the second compartment.

6. A crucible according to claim 4, wherein each of the first and third compartments is at an obtuse angle to the second compartment, thereby constituting a U-shaped structure with two diverging branches.

7. A crucible according to claim 1, wherein the first, second, and third compartments are disposed in a Z-shaped structure.

8. A crucible according to claim 1, wherein its section is rectangular in shape.

9. A crucible according to claim 1, wherein its section is trapezoidal.

10. A crucible according to claim 1, wherein its section is circular.

11. Apparatus for vapor deposition at high temperature, the apparatus comprising a thermally insulating enclosure, the first, second, and third diffusers for constituting first, second, and third isothermal heating zones respectively around first, second, and third compartments of a removable closed crucible designed to contain a source material in said first compartment and a substrate in the second compartment; wherein the first, second, and third diffusers are thermally independent from one another by construction, each of them having a U-shaped section to surround the first, second, and third compartments of the crucible respectively, and wherein said first, second, and third compartments are disposed in non-aligned manner along an angled line such that the angles between said first, second, and third compartments provide thermal decoupling of radiant energy between said compartments.

12. Apparatus according to claim 11, wherein the crucible is made of a material that is transparent to infrared radiation, such as quartz, and includes planar observation windows in its connection portions firstly between the first and second compartments and secondly between the second and third compartments, and wherein the insulating enclosure of the apparatus includes thermally insulating removable plugs located opposite said planar observation windows to enable light rays to be sent selectively along the axis of the second compartment of the crucible in order to observe the deposit inside said second compartment optically.

13. Apparatus according to claim 12, wherein the planar observation windows are inclined relative to the axis of the second compartment in such a manner that a polarized light beam for observation purposes propagating along the axis of the second compartment strikes said observation windows at the Brewster angle.

14. Apparatus according to claim 11, wherein the insulating enclosure includes a door extending essentially along the longest dimension of the second compartment of the crucible and movable in a direction that is essentially transverse relative to the axis of the second compartment, thereby enabling the crucible to be loaded and unloaded.

15. Apparatus according to claim 11, wherein each of the first, second, and third diffusers is fixed on a common base via insulating columns.

16. Apparatus according to claim 11, wherein at least the second diffuser includes heat pipes for ensuring the isothermal nature of the zone corresponding to said diffuser along the axis of the second compartment of the crucible.

17. Apparatus according to claim 11, wherein the first, second, and third compartments of the crucible, and the first, second, and third diffusers are disposed in a U-shaped structure.

18. Apparatus according to claim 17, wherein the crucible is rectangular in section, wherein the first, second, and third U-shaped section diffusers include at least one inside wall that is sloping, and wherein triangular-section heat conducting wedges are interposed between the crucible and the sloping inside walls of the diffusers.

19. Apparatus according to claim 17, wherein the crucible has a tapezoidal section, wherein each of the first and third compartments is at an obtuse angle relative to the second compartment, thereby constituting a U-shaped structure with two diverging branches, and wherein the first, second, and third diffusers match the shapes of the crucible in such a manner as to provide both direct thermal contact by conduction between the first, second, and third diffusers and the first, second, and third compartments respectively, and also automatic centering of the crucible.

20. Apparatus according to claim 11, wherein the first, second, and third compartments of the crucible, and the first, second, and third diffusers are disposed in a Z-shaped structure.

21. Apparatus according to claim 14, including an automatic crucible loading and unloading mechanism having a vertical storage passage for storing crucibles, a carriage for positioning the crucibles in the vertical storage passage, and door displacement means for automatically transferring a crucible between the vertical storage passage and the thermally insulating enclosure and vice versa.

* * * * *